United States Patent [19]

Ratcliff

[11] Patent Number: 4,588,917

[45] Date of Patent: May 13, 1986

[54] DRIVE CIRCUIT FOR AN ULTRASONIC GENERATOR SYSTEM

[76] Inventor: Henry K. Ratcliff, 14 Hadfield Avenue, Hoylake, Wirral, Merseyside, L47 3DJ, England

[21] Appl. No.: 682,236

[22] Filed: Dec. 17, 1984

[30] Foreign Application Priority Data

Dec. 17, 1983 [GB] United Kingdom ................. 8333696

[51] Int. Cl.⁴ ............................................. H01L 41/08

[52] U.S. Cl. ...................................... 310/316; 310/26; 310/317; 318/116; 318/118

[58] Field of Search ................................ 310/316-318, 310/26; 318/116, 118; 330/291, 196, 302; 307/261

[56] References Cited

U.S. PATENT DOCUMENTS

| | | | |
|---|---|---|---|
| 3,582,733 | 6/1971 | Brubaker | 310/316 |
| 3,596,206 | 7/1971 | Loria | 310/316 X |
| 3,638,087 | 1/1972 | Ratcliff | 318/118 |
| 3,651,352 | 3/1972 | Puskas | 310/316 |
| 3,866,068 | 2/1975 | Krenicki et al. | 318/116 X |
| 4,318,164 | 3/1982 | Onodera et al. | 363/21 |
| 4,359,697 | 11/1982 | Takahashi | 310/316 X |
| 4,383,292 | 5/1983 | Onodera et al. | 363/21 |
| 4,389,601 | 6/1983 | Sullivan | 310/26 X |
| 4,431,975 | 2/1984 | Podlesny | 310/316 X |
| 4,469,974 | 9/1984 | Speranza | 310/316 |

FOREIGN PATENT DOCUMENTS

| | | | |
|---|---|---|---|
| 0150556 | 9/1981 | U.S.S.R. | 310/316 |

OTHER PUBLICATIONS

Sokal et al., "Class E-A New Class of High-Efficiency Tuned Single-Ended Switching Power Amplifiers", IEEE Journal of Solid-State Circuits, vol. SC-10, No. 3, Jun., 1975, pp. 168-176.

*Primary Examiner*—Mark O. Budd
*Attorney, Agent, or Firm*—Staas & Halsey

[57] ABSTRACT

An ultrasonic generator system comprising a power oscillator which provides an A.C. signal for driving one or more ultrasonic transducers (TDM). The power oscillator includes a transistor ($Tr_1$) in series wtih the parallel combination (for A.C. purposes) of a capacitor ($C_1$) and an inductance ($L_1$). The transducer load TDM is connected across the inductance $L_1$ without the use of an intermediate transformer.

6 Claims, 14 Drawing Figures

DRIVE CIRCUIT FOR AN ULTRASONIC GENERATOR SYSTEM

BACKGROUND OF THE INVENTION

The present invention is concerned with ultrasonic generators for use in power ultrasonic applications, such as cleaning or welding.

Ultrasonics companies involved in power ultrasonic applications, such as cleaning and welding, have made considerable efforts over the past 10 to 20 years to develop electronic generators of higher efficiency than those readily available and usually base on conventional class B or class C circuits, as used in radio transmission—the area from which the earliest (vacuum tube) ultrasonic generators were drawn.

The disadvantages of class B and class C circuits are fully described in U.S. Pat. No. 3,648,188 (Ratcliff) to which reference is hereby directed. It is well recognised that class B enables a high output to be obtained from a transistor at the price of low efficiency whereas class C permits high efficiency at the cost of low output. Class Bx, described in U.S. Pat. No. 3,648,188, was developed with the aim of combining the advantages of both class B and C, with the disadvantages of neither. Further reference to class Bx amplifiers is made below.

The most common circuits in general use for power ultrasonics applications are based on the bridge principle in which the load is switched between high and low lines and requires pairs of transistors to effect the necessary switching action. The accompanying FIG. 1 shows diagrammatically a typical full-bridge circuit. The switches are controlled in pairs so that in a first condition $S_1$ and $S_2$ are open and $S_3$ and $S_4$ closed and in a second condition $S_3$ and $S_4$ are open and $S_1$ and $S_2$ are closed. In this manner the current through the load is repeatedly reversed at the necessary operating frequency.

FIG. 2 shows a known half-bridge arrangement utilising two switches $S_1$ and $S_2$. When $S_1$ is closed and $S_2$ open the load is charged up. When $S_1$ opens and $S_2$ is closed the load discharges. This cycle is repeated to provide the operating frequency.

The half-bridge of FIG. 2 operates by allowing one half sinusoid of the current to flow whilst $S_1$ is closed, the period being determined by the LC resonant characteristic. At the end of this period, $S_1$ must be made to open and $S_2$ to close, resulting in a half-sinusoid of current in the reverse direction through the load circuit and so completing a full sinusoidal oscillation of the current. The voltage across the circuit is, however, not sinusoidal but is a square wave as a result of $S_1$ and $S_2$ forming a changeover switch, as illustrated in FIG. 3.

The configurations of FIGS. 1 and 2 have, however, inherent design problems. In particular they have the problem of dual conduction in which the switches may momentarily be closed together as a result of poor synchronisation of the necessary control signals or transistor switching speeds. In this event, the switches appear as a short-circuit across the D.C. supply.

However, with careful design, "zero voltage switching" can be achieved—this being a necessary condition for high-level circuit efficiency, although maximum operating frequency is limited by the dual conduction characteristic, when using commercially available power transistors, to about 100 kHz.

FIG. 4 shows the known class Bx circuit of U.S. Pat. No. 3,648,188 which operates to provide "zero crossing" of "zero voltage switching" in the manner described in that patent. A principal feature of the known circuit is the transformer $T_1$ which has always been considered essential to the operation of this type of circuit. The transformer $T_1$ supplies a d.c. path for the current through the transistor $Q_1$ which has to be switched in order to generate the necessary power oscillation.

The presence of this transformer $T_1$ is, however, disadvantageous in practice. It is a relatively massive and expensive component. Furthermore, in order to achieve the generator power output required, the transformer has to carry the full load current in its secondary winding and the load current plus d.c. supply current in its primary winding. Therefore, heavy conductors are needed for both windings to carry these large currents. Moreover, substantial magnetic core material is needed to handle the high flux levels created by the high frequency current. In order to reduce the heat generated, forced air cooling is required when high levels of ultrasonic power are to be generated with transformers of acceptable dimensions and cost. Although it is possible to avoid forced air cooling by loadsharing in which two transformers are used, whichever way is chosen the bulk and cost is high, especially where high reliability in high ambient temperatures is required.

A further disadvantage of the transformer $T_1$ is the necessity for critical design. The inductance of the primary (on which the secondary is based) must be neither too low nor too high and so it has to be manufactured within close tolerances. (If the inductance is too low, too much current flows in the primary; if too high, it cannot supply sufficient energy under varying load conditions—typically the case with ultrasonic cleaning systems).

The commercial need is to develop circuitry that will lower the cost per watt of output power. Attention has previously been directed to the transistor circuitry because of, as mentioned above, the relatively low efficiency of class A and B and the relative ineffectiveness of class C in using the potential of the power transistor indicated by its maximum voltage and current characteristics. However, since the known circuit of FIG. 4 has theoretical transistor efficiencies of 100%, no further significant progress in circuit design seems likely in this direction.

The real problem, and the area where substantial inefficiency arises, is thus in the magnetic components and the principal objective of the present invention has been to improve the performance significantly in this area.

SUMMARY OF THE INVENTION

It is an object of the present invention to find a means of obviating altogether the necessity for the transformer $T_1$ in the known circuit of FIG. 4.

According to one aspect of the present invention, there is provided an ultrasonic generator comprising a switching transistor connected in series with an inductance across a D.C. supply, and a capacitor connected (for A.C. purposes) in parallel with the inductance, an ultrasonic transducer load being connected across the inductance.

According to a second aspect of the present invention, there is provided a transistor power circuit for driving an ultrasonic transducer, both of the piezo-electric and the magnetostrictive type, comprising a switching transistor connected in series with an inductance across a D.C. supply, and a capacitor connected (for A.C. purposes) in parallel with the inductance, for transducer load being arranged, in use, to be connected across the inductance.

It is found, using this arrangement, that, compared with the known arrangement wherein the transformer primary is in series with the transistor across the D.C. supply and the transducer is connected to the transformer secondary and is therefore isolated (for D.C. purposes) from the transistor circuit, the inductance carries far less of the total current than did the primary of the transformer. For this reason, the inductance can be a relatively small component. Alternatively, an inductance of similar size and cost to the old transformer can provide much greater system output power.

In the event that the transducer is of the piezo-electric type, there would normally be provided in series with the transducer an inductance to ensure resonance and achieve sinusoidal drive to the transducer. When the transducer is of the magnetostrictive type on the other hand, a series capacitor would be included for similar reasons.

BRIEF DESCRIPTION OF THE DRAWINGS

The invention is described further hereinafter, by way of example only, with reference to the accompanying drawings, wherein.

DESCRIPTION OF THE PREFERRED EMBODIMENTS

Figure 9:
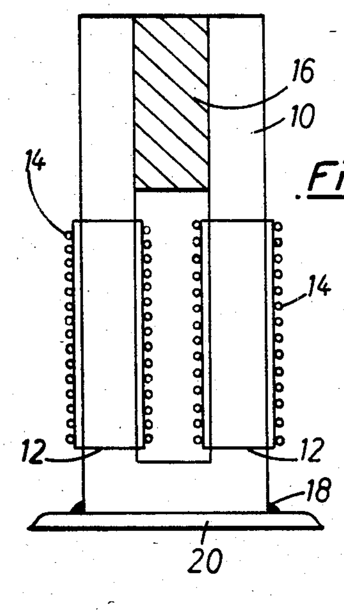
FIG. 9 shows one embodiment of a typical magnetostrictive type ultrasonic transducer.

FIG. 9 shows, for the purposes of information, a typical magnetostrictive transducer which comprises a plurality (for example 560) of generally U-shaped metal laminations 10 formed into a stack. Each leg of the stack carries a respective coil former 12 bearing a coil 14, the two coils 14 normally being connected in series. The free ends of the arms of the U-shaped laminations 10 are interconnected by a common biassing magnet (permanent magnet) 16 which imposes a permanent strain in one direction above which a full-wave oscillation can take place when the transducer is energised by a sinusoidal current applied to the coil. The operational necessity for bias in this, or some other manner, is well known and will not be described further. The base of the U-shaped stack is permanently bonded, for example by brazing at 18, to a metal diaphragn plate 20, which, in use, is adapted to be rigidly coupled to the side or base of a tank containing liquid and the article(s) to be ultrasonically cleaned.

Figure 10:
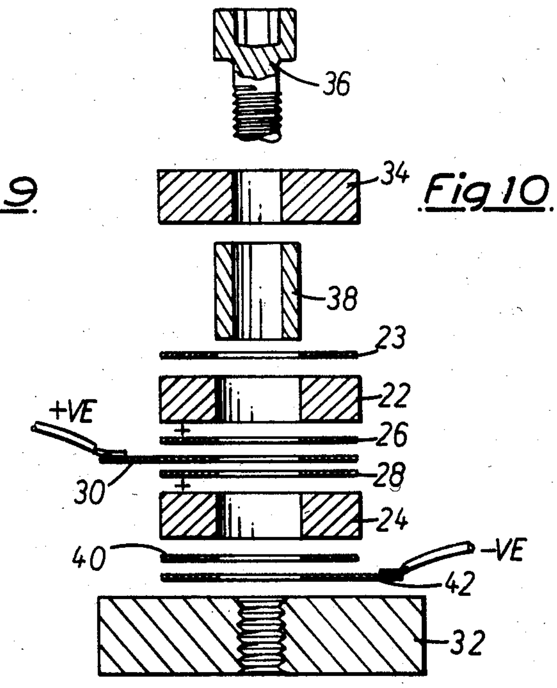
FIG. 10 is an exploded view of one embodiment of a piezo-type ultrasonic transducer.

The piezo-electric transducer shown by way of example in FIG. 10 comprises a pair of annular piezo discs 22,24, separated by a pair of phosphor-bronze washers 26,28 and a brass electrode 30, and clamped rigidly and coaxially to an aluminum diaphragm plate 32 by means of a mild steel cap 34 and a cap screw 36. A nylon bush 38 is used to centre the cap screw 36. A further phosphor bronze washer 23 is disposed between the piezo-element 22 and the cap 34. A still further phosphor-bronze washer 40 and a further brass electrode 42 are disposed between the element 24 and the plate 32. In use, a high alternating voltage is connected across the electrodes 30 and 42, the plate 32 being coupled rigidly to the tank which receives articles to be cleaned.

Figure 1:
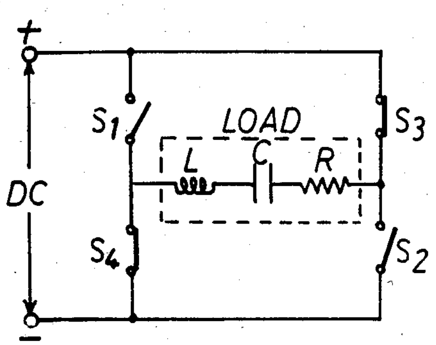
Fig 1 PRIOR ART
FIG. 1 shows diagrammatically a known full bridge circuit for driving an ultrasonic generator.
Figure 2:
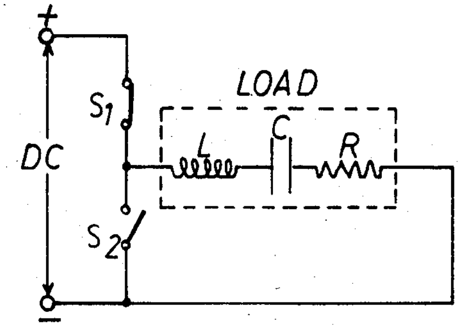
Fig 2 PRIOR ART
FIG. 2 shows diagrammatically a known half-bridge circuit for driving an ultrasonic generator.
Figure 3:
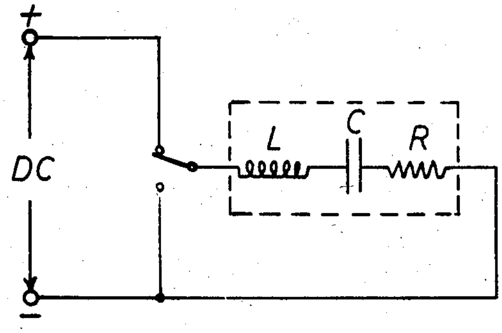
Fig 3 PRIOR ART
FIG. 3 shows another way of representing the circuit of FIG. 2.
Figure 4:
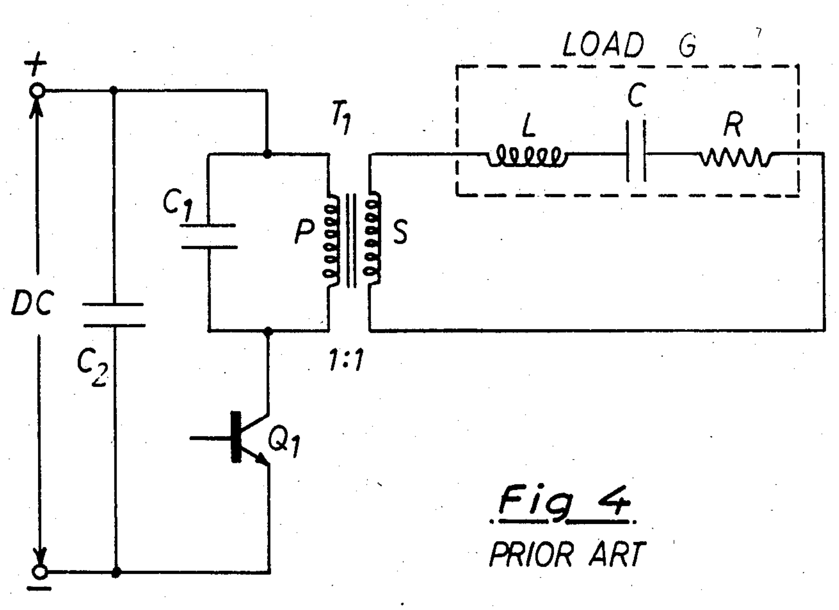
Fig 4 PRIOR ART
FIG. 4 shows in simplified form the known class $B_x$ circuit of U.S. Pat. No. 3,648,188.

In FIG. 4 the primary of transformer $T_1$ is connected in parallel with a capacitor $C_1$, this parallel combination being connected in series with the collector-emitter path of a power switching transistor Q across a D.C. supply. A capacitor $C_2$ is connected across the supply. The secondary of the transformer $T_1$ is connected in series with an ultrasonic generator load G.

The load G can be a piezoelectric transducer (such as shown in FIG. 10) represented by capacitance C and acoustic resistance R, with external inductance L (mounted on the generator board) in electrical resonance with the electrical capacitance of the transducer.

Alternatively, the load could be magneto-strictive (such as shown in FIG. 9) in which case the transducer would be represented by L and R—with C providing the external capacitance needed for electrical resonance at the mechanical resonance of the system.

For a detailed explanation of the operation of the circuit of FIG. 4, reference is directed to the description contained in U.S. Pat. No. 3,648,188, the contents of which are incorporated herein by way of reference.

A further example of a previous circuit using a transformer to couple the oscillating circuit to the ultrasonic transducer load is described in my pending U.S. application Ser. No. 554,908 now allowed (particularly FIG. 6 thereof) the contents of which are also incorporated hereby by way of reference.

During experiments with a 20 kHz magnetostrictive system of the type shown in present FIG. 4 and operating from 117 volts A.C., it was observed that a very high temperature rise of the order of 50° C. above ambient was occurring in transformer $T_1$. This temperature rise is attributable to the high peak to peak current of about 25 amps which occurs in the transformer primary.

In the course of experimentation, the secondary winding of transformer $T_1$ was bypassed so that the load was connected across the transformer primary winding. A surprising and unpredicted result occurred. After a slight adjustment of the value of capacitor $C_1$ to restore the original conditions, it was found that the current in the primary winding of $T_1$ had dropped from 25A peak to peak to 5A peak to pead and that the transformer assembly remained very cool—less than 10° C. after several hours—yet input power, output power and performance were as before.

Figure 5:
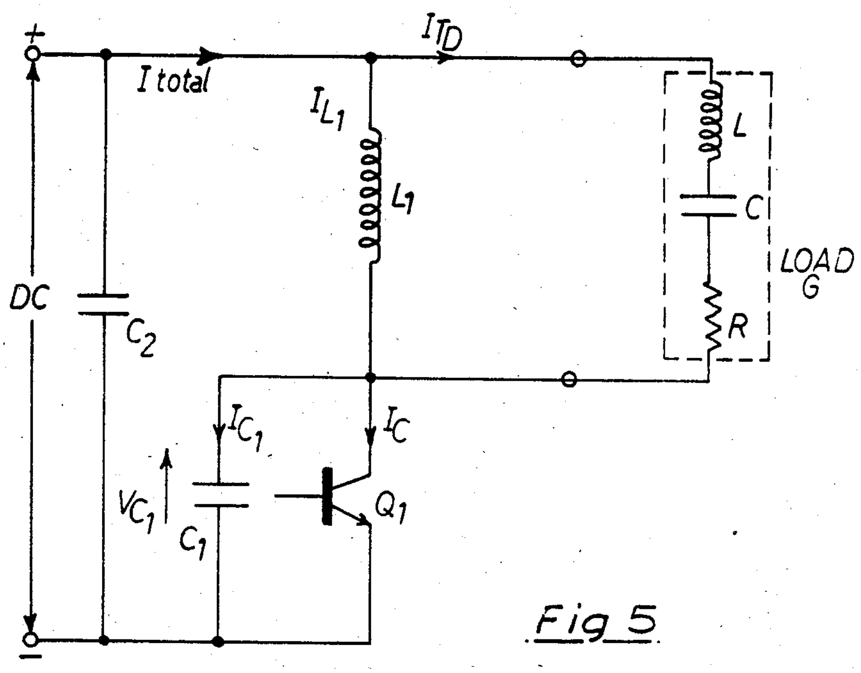
FIG. 5 is a circuit diagram of one embodiment in accordance with the present invention.

FIG. 5 shows a circuit modified in accordance with the invention. In this circuit, the transformer is replaced by an inductance $L_1$ whose dimensions, because of the low current being carried, can be drastically smaller than that of the transformer $T_1$ of FIG. 4.

In FIG. 5, the capacitor $C_1$ has been connected to the negative supply rail in order to clarify the operation.

(This connection has no effect on the performance because, for A.C. purposes, it is still connected across inductance P via capacitor $C_2$ and its effective value is changed by a negligible amount).

The outstanding benefit provided by the new circuit is the elimination of the disadvantages of the old circuit inherent in its transformer. In this respect, not only has the heat, the bulk and the cost problem been avoided, but also critical design parameters have been eliminated.

By way of example of the latter point, reference is made to FIGS. 7(*a*) to 7(*d*) which show a number of experimentally obtained curves taken from a test circuit corresponding to FIG. 5.

FIG. 7(*a*) shows the A.C. current flowing in the inductance $L_1$ of FIG. 5 when it has a value of 760 $\mu$H, this being the optimum value of inductance for the transformer primary winding P of FIG. 4 driving the same load. The steady D.C. offset of 2 Amps will be noted. FIG. 7(*b*) shows how the total current is of considerably greater peak to peak amplitude than the current $I_{L1}$. FIG. 7(*c*) shows the load current $I_{TD}$.

It was found with the test circuit that the value of the inductance $L_1$ can be increased to 2.6 mH without adverse effect on system performance - provided that a corresponding reduction in the value of capacitor $C_1$ is also made to maintain correct zero voltage or zero crossing conditions.

FIG. 7(*d*) shows the current $Ic_1$ flowing into and out of the capacitor $C_1$. FIG. 7(*d*) shows the collector current in the transistor $Q_1$.

Applying Kirchoff's Law to the circuit of FIG. 5, one obtains:

$$I(\text{total})(\text{FIG. } 7b) = I_{L1}(\text{FIG. } 7a) + I_{TD}(\text{FIG. } 7c) = Ic_1(\text{FIG. } 7d) + Ic(\text{FIG. } 7e)$$

It is believed that the inductance $L_1$ serves a multirole function. It acts as a timing element, operating in conjunction with $C_1$—but unlike $C_1$ is not required to carry heavy current loads. It also acts as a path for D.C. current to be fed to the switching transistor $Q_1$. Since the total current drawn from the D.C. power supply I total (FIG. 7(*b*))=Ic (FIG. 7(*e*))+$Ic_1$ (FIG. 7(*d*)), it seems that the switching transistor $Q_1$ and capacitor $C_1$ operate in unison to "chop" the direct current being supplied through $L_1$. Furthermore, it seems that $C_1$, since for A.C. purposes it is in parallel with $L_1$, provides the drive voltage at the input to the load (transducer) circuit.

Figure 6:
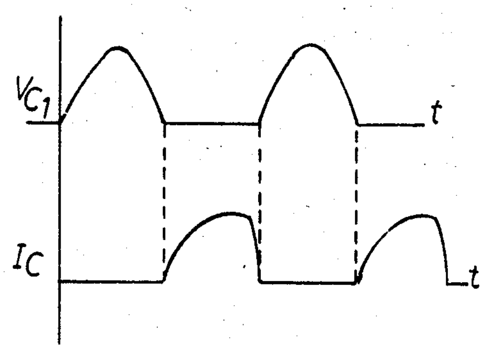
FIG. 6 illustrates the zero-crossing of the circuit.
Figure 7A:
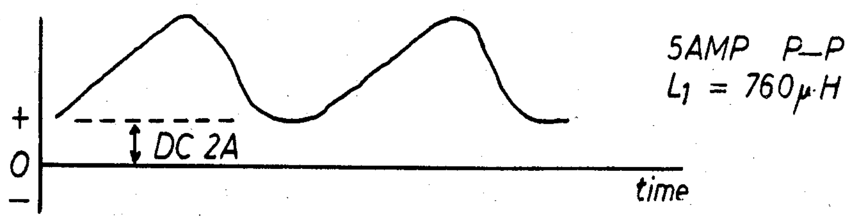
FIGS. 7(*a*) to 7(*d*) show various waves used to illustrate the operation of the circuit.
Figure 7B:
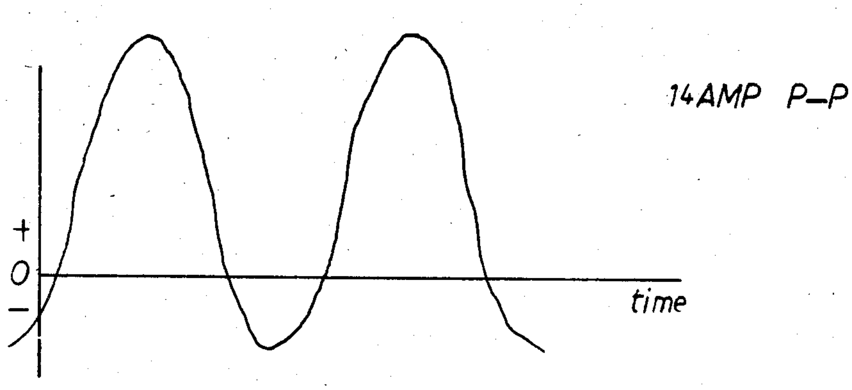
Figure 7C:
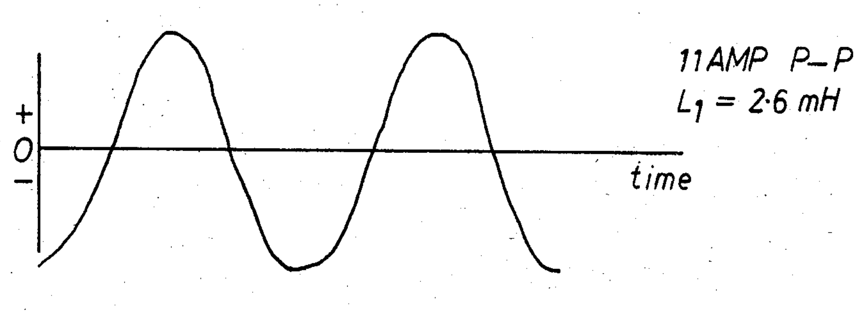
Figure 7D:
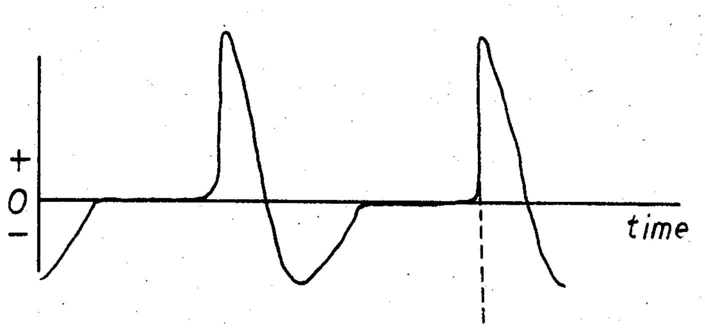
Figure 7E:
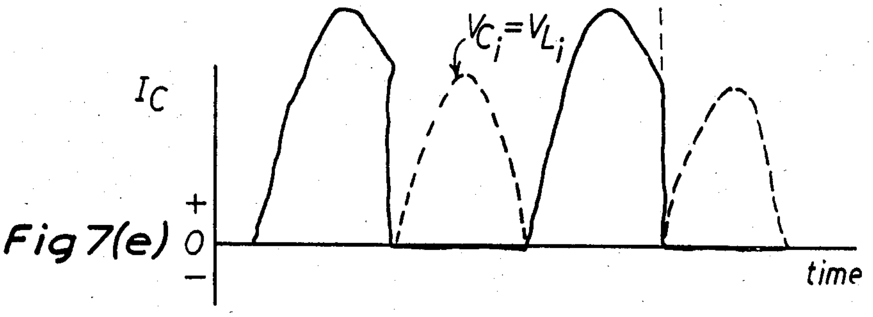

FIG. 6 illustrates diagrammatically the zero-crossing operation of the circuit wherein the current Ic begins to rise only when the voltage $Vc_1$ is at a minimum and vice versa.

The described circuit is believed to provide a significant step forward in the area of cost reduction, volumetric reduction, and improvement in general overall efficiency and hence reliability by reduction in heat developed per watt of output power.

Figure 8:
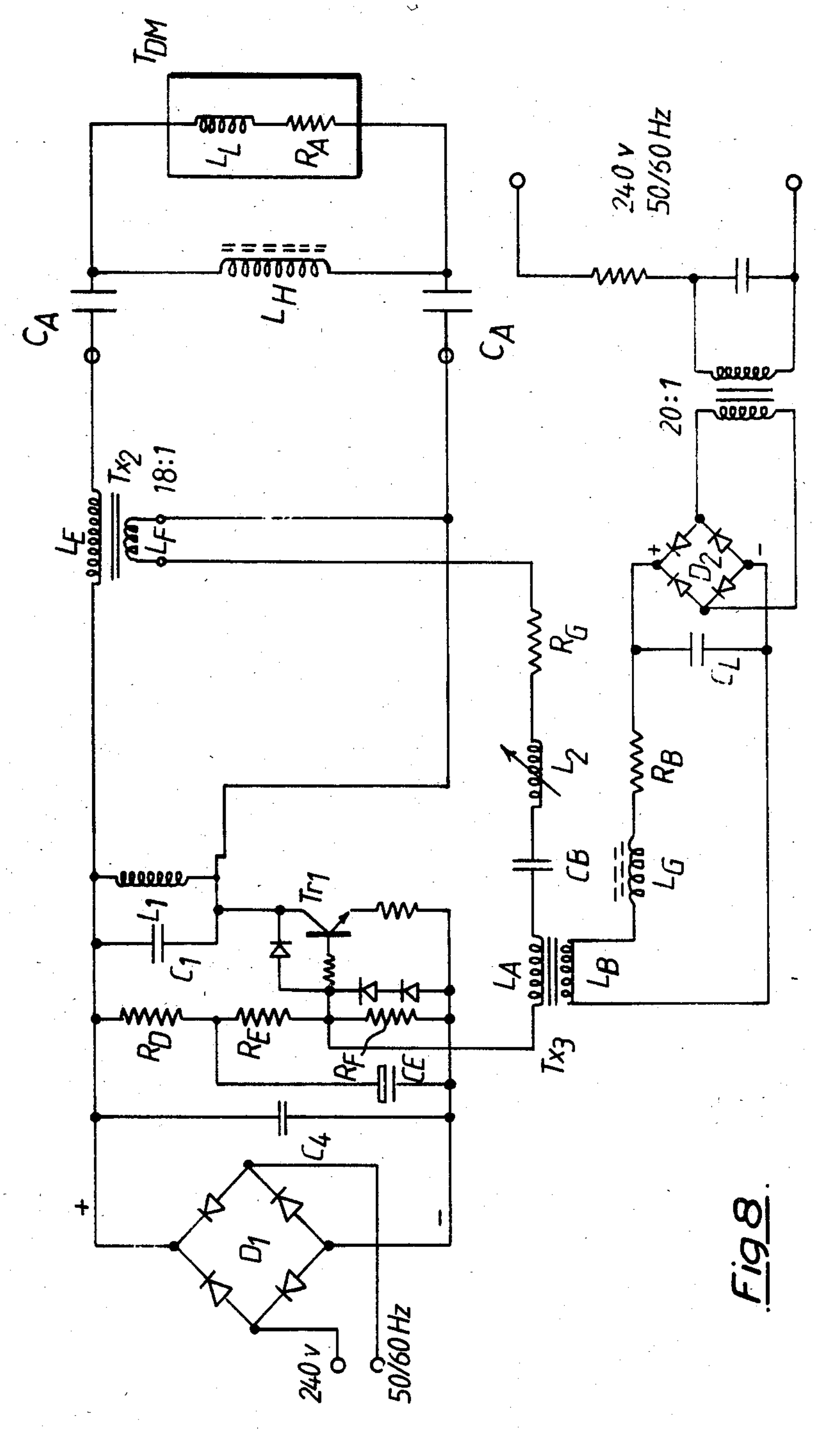
FIG. 8 is a circuit diagram of a practical embodiment incorporating the present invention.

FIG. 8 is a circuit diagram of a practical embodiment of a transducer driving system incorporating the present invention. This system includes the "frequency sweep" and "autofollow" features of FIG. 6 of my U.S. patent application Ser. No. 554,908.

The term "frequency sweep" refers in principle to a technique of continuously varying the oscillation frequency above and below a pre-set centre frequency, e.g. from a high of 22 KHz to a low of 20 KHz about a centre frequency of 21 KHz. The term "autofollow", on the other hand, refers to an arrangement where the operating frequency of the oscillator is made to follow some specific predetermined operating characteristic of the system. Attention is again directed to U.S. application Ser. No. 554,908 for a full discussion of these features.

Referring now to FIG. 8, although this system is described in relation to the control of magnetostrictive ultrasonic transducers, it is to be understood that, it could equally well be used to drive piezo transducers. The generator system comprises a power oscillator which includes the parallel combination of a capacitor $C_1$ and inductance $L_1$ in series with the emitter-collector path of a transistor $Tr_1$ across a D.C. supply provided by a full wave rectifier $D_1$. The smoothing capacitor $C_4$ is of sufficiently small value that the D.C. is modulated at 100 Hz to provide some amplitude modulation of the D.C.

Base bias for the transistor $Tr_1$ is provided by means of resistors $R_D$, $R_E$ and $R_F$. A capacitor $C_E$ connects the junction of $R_D$ and $R_E$ to the negative rail providing a switch-on surge protection.

A transducer load TDM is connected across the parallel circuit of the inductance $L_1$ and capacitor $C_1$ via two capacitors CA and an inductance $L_E$. The transducer is assumed here to be of the magnetostrictive type and is represented by the series combination of a 1 mH inductance $L_L$ and a 100 $\Omega$ resistor $R_A$. The inductance $L_L$ might, for example, increase to 1.5 mH with liquid temperature. The capacitors CA serve to provide DC for the load TDM.

To provide "autofollow", the inductance $L_E$ is made the primary of a transformer $Tx_2$ having a secondary $L_F$ whose one end is connected to the negative rail and whose other end is connected to the base of transistor $Tr_1$ via a series combination which includes a resistor RG, a trimmer inductor L2, and a capacitor CB. This circuit operates to provide current feedback to the transistor dependent entirely on the current passing through LE and hence on the current in the load TDM. CB is a high value blocking capacitor to prevent D.C. from entering $L_F$; it has no frequency determining function. From consideration of FIG. 8, it will be appreciated that the prime frequency determining element is the load TDM itself and that the system will allow feedback currents only at the resonant frequency of the transducer, i.e. the feedback current seeks to maximise the current in the load TDM. Consequently, if the resonant frequency of the load TDM changes, for example due to temperature changes, then the generator frequency will automatically adjust to this new frequency.

Some phase correction may be needed to ensure that the input to the transistor is in accurate antiphase relationship to its output, as a result of unwanted slight phase shifts in other components in the loop. $L_2$ is provided for such correction.

Some typical component values for the principal components have been included in the practical circuit diagram of FIG. 8.

The use of the autofollow technique in this manner enables the system to maintain high efficiency when using a single transducer, by operating the transducer so that it is constantly at mechanical resonance. In such a case, if the dimensions of the mechanical system alter for whatever reason, then a corresponding change in the frequency of the electrical drive ensues to maintain the resonant condition.

However, in a practical system, there would normally be more than one transducer and in this event the autofollow circuit would adjust the generator frequency for the highest level of output current and this can only be that frequency that produces the highest summation of currents to the group of transducers. However, it could be that only one, or even none, of the transducers is operating precisely at its resonant frequency and thus the operational efficiency would still be likely to be low.

This problem can be overcome by combining with the autofollow technique described above the frequency sweep technique referred to above. For this purpose, the feedback loop to the transistor $Tr_1$ includes the secondary $L_A$ of a transformer $Tx_3$ whose primary $L_B$ is connected via an inductor $L_G$ and a resistor $R_B$ to a substantially unsmoothed full-wave rectifier circuit $D_2$ driven via a step-down transformer (for example 20:1) from the mains supply. The primary winding LB is thereby subjected to a 100 Hz signal which is effective to vary the inductance of $L_A$ sufficient to cyclically sweep the frequency of oscillation of the transistor $Tr_1$ from, for example, 20.0 KHz to 20.2 KHz. This is found in practice to be sufficient to encompass the resonant frequencies of all transducers in a batch.

What is achieved, therefore, is a servo system that automatically finds the centre frequency of a transducer batch, each member of which may have a slightly different resonant frequency from every other member, together with a frequency sweep from that centre frequency which ensures that each transducer is "peaked" in turn repetitively. The system is able to follow the centre resonance as the physical dimensions of the transducer change with operational temperature or other resonance changes occurring due to tank loading.

On consideration, it is surprising that these two techniques can be successfully combined in the described manner since they would appear in theory to be mutually contradictory. One would expect that, using the autofollow technique, once correct phasing had been established the circuit would not admit the introduction of a frequency sweep as it apparently would produce instability or failure to work at all. Thus, it had been considered previously that voltage and current feedback systems were mutually exclusive, voltage feedback being useless for autofollow because it does not sense the output current which maximises at the resonant frequency of the transducer and current feedback, since this is powerfully determined by the load, being nonvariable in frequency without instability and/or failure.

It has been established in practice, however, that the two techniques can be combined without any instability or failure provided that the tuning/phase correction circuit composed by $L_A$, $L_2$ and $C_B$ has a low Q factor and that the magnitude of the sweep established via $Tx_3$ is relatively low. However, since the variation in frequency from the centre frequency necessary to encompass all of the resonant frequencies of the transducers is also of the same low order then the variation capable of being achieved is quite sufficient for the present purposes.

The combination of frequency sweep and autofollow has been found to produce a dramatic improvement in cleaning performance compared to traditional systems—both in cavitation intensity and in uniformity of cavitation within the cleaning liquid. This is especially important in magneto-strictive systems such as the one described above which, because of the relatively low transducer efficiency, must operate at or very close to resonant frequency throughout—a requirement virtually impossible to be met by a fixed frequency drive from a low level oscillator, and still not met by an autofollow circuit or frequency sweep circuit operating alone. Operating in combination, however, the autofollow circuit sets the generator centre frequency at an optimum level (maximum output current) and the frequency sweep circuit provides a second order control to ensure that all transducers are periodically peaked. Thus, for example, when banks of transducers are interchanged using the same generator, the centre operating frequency is changed automatically to suit the new bank, the sweep action compensating for the various resonant frequencies of individual transducers within the batch.

Coupled with the presently described means of eliminating the traditional transformer, these techniques result in a cheaper, smaller but more effective system for driving ultrasonic transducers.

I claim:

1. An ultrasonic generator system, comprising:

(a) a D.C. supply;

(b) an inductance;

(c) a switching transistor having an input;

(d) said inductance and said switching transistor being connected in series across said D.C. supply;

(e) a capacitor connected (for A.C. purposes) in parallel with said inductance;

(f) reactive means for providing a reactance;

(g) an ultrasonic transducer;

(h) said reactive means and said transducer being connected in series to form load means for providing a load and an electrical resonant circuit formed by said reactive means and the electrical reactance of the said transducer;

(i) said load means being connected in parallel across said inductance; and (j) a power amplifier including said switching transistor, said inductance, said capacitor and said reactive and for driving said ultrasonic transducer with a sinusoidal load current which does not flow in said inductance, and which is controlled by an A.C. signal voltage applied to the input of the said switching transistor.

2. An ultrasonic generator system, comprising:

(a) a D.C. supply;

(b) an inductance having two ends;

(c) a switching transistor having an input;

(d) said inductance and said switching transistor being connected in series across said D.C. supply;

(e) a capacitor connected (for A.C. purposes) in parallel with said inductance;

(f) reactive means for providing a reactance;

(g) an ultrasonic transducer;

(h) said reactive means and said transducer being connected in series to form load means, having two ends, for providing a load and comprising an electrical resonant circuit formed by said reactive means and the electrical reactance of the said transducer;

(i) a pair of capacitors and the two ends of said load means being coupled to the two ends of said inductance by way of respective capacitors of said pair to D.C. isolate said load means from said D.C. supply; and (j) a power amplifier including said switching transistor, said inductance, said capacitor and said reactive and for driving said ultrasonic transducer with a sinusoidal load current which does not flow in said inductance, and which is controlled by an A.C. signal voltage applied to the input of the said switching transistor.

3. An ultrasonic generator system, comprising:

(a) a D.C. supply;

(b) an inductance;

(c) a switching transistor having an input;

(d) said inductance and said switching transistor being connected in series across said D.C. supply;

(e) a capacitor connected (for A.C. purposes) in parallel with said inductance;

(f) plural ultrasonic transducers;

(g) plural reactive means for providing reactances;

(h) each said transducer being connected in series with said reactive means to form respective transducer load means for providing a load and comprising an electrical resonant circuit formed by the the associated reactive means and the electrical reactance of the associated transducer;

(i) each said load means being connected in parallel across said inductance;

(j) a power amplifier including said switching transistor, said inductance, said capacitor and each said reactive means and for driving said ultrasonic transducers with a sinusoidal load current which does not flow in said inductance, and which is controlled by an A.C. signal voltage applied to the input of the said switching transistor;

(k) first means, responsive to the current supplied to said transducer load means, for varying the frequency of said sinusoidal load current to maintain the transducer currents at a maximum level and determining an operating frequency thereby; and (l) second means operating independently of said first means for cyclically sweeping, between upper and lower limits, the operating frequency determined by said first means.

4. An ultrasonic generator system, comprising:

(a) a D.C. supply;

(b) an inductance;

(c) a switching transistor having an input;

(d) said inductance and said switching transistor being connected in series across said D.C. supply;

(e) a capacitor connected (for A.C. purposes) in parallel with said inductance;

(f) plural ultrasonic transducers;

(g) plural reactive means for providing a reactance;

(h) each said transducer being connected in series with a said reactive means to form respective transducer load means for providing a load and comprising an electrical resonant circuit formed by the associated reactive means and the electrical reactance of the associated transducer;

(i) each said load means being connected across said inductance;

(j) a power amplifier including said switching transistor, said inductance, said capacitor and each said reactive means and for driving said ultrasonic transducers with a sinusoidal load current which does not flow in said inductance, and which is controlled by an A.C. signal voltage applied to the input of the said switching transistor;

(k) first means, responsive to the current supplied to said transducer load means, for varying the frequency of said sinusoidal load current to maintain the transducer currents at a maximum level and determining an operating frequency thereby and having a feedback path;

(l) said first means including a first transformer whose primary winding is disposed in series with said plural transducers and having a secondary lying in said feedback path controlling the operating frequency;

(m) second means operating independently of said first means for cyclically sweeping, between upper and lower limits, the operating frequency determined by said first means; and (n) said second means including a second transformer having a secondary disposed in said feedback path and having a primary subjected to an oscillating signal which causes the inductance of the primary winding in said feedback path to vary in a correspondingly cyclic manner.

5. An ultrasonic generator system according to claim 4, wherein said feedback path additionally includes a variable trimmer inductance which enables the phase of the feedback signal to be adjusted.

6. An ultrasonic generator system, comprising:

a D.C. supply;

a first capacitance connected in parallel with said D.C. supply forming first and second connection points;

a second capacitance connected to the first connection point;

a switching transistor connected to the first connection point, connected to the second capacitance forming a third connection point and having an input receiving a switching signal;

an inductance connected between the first and third connection points; and transducer load means, connected between the first and third connection points in parallel with said inductance, for producing ultrasonic sound and providing a capacitance, an acoustic resistance and an inductance in series.

* * * * *